United States Patent
Yan et al.

(10) Patent No.: US 12,507,388 B2
(45) Date of Patent: Dec. 23, 2025

(54) DEPOSIT DEVICE

(71) Applicants: Henan Fuchi Technology Co., Ltd., Zhengzhou (CN); HONGFUJIN PRECISION ELECTRONICS (ZHENGZHOU) CO., LTD., Zhengzhou (CN); HON HAI PRECISION INDUSTRY CO., LTD., New Taipei (TW)

(72) Inventors: Yan-Fang Yan, Zhengzhou (CN); Hai-Qiang Li, Zhengzhou (CN); Jun Chen, Shenzhen (CN)

(73) Assignees: Henan Fuchi Technology Co., Ltd., Zhengzhou (CN); HONGFUJIN PRECISION ELECTRONICS (ZHENGZHOU) CO., LTD., Zhengzhou (CN); HON HAI PRECISION INDUSTRY CO., LTD., New Taipei (TW)

( * ) Notice: Subject to any disclaimer, the term of this patent is extended or adjusted under 35 U.S.C. 154(b) by 393 days.

(21) Appl. No.: 18/112,984

(22) Filed: Feb. 22, 2023

(65) Prior Publication Data

US 2023/0269920 A1 Aug. 24, 2023

(30) Foreign Application Priority Data

Feb. 24, 2022 (CN) .......................... 202210170645.4

(51) Int. Cl.
*B65H 20/16* (2006.01)
*H05K 13/02* (2006.01)
*H05K 13/04* (2006.01)

(52) U.S. Cl.
CPC ..... *H05K 13/0215* (2018.08); *H05K 13/0419* (2018.08)

(58) Field of Classification Search
CPC .......................... Y02P 70/50; H05K 13/0215; H05K 13/0419; B65H 20/16; B65H 20/30; B65H 21/00
USPC .......................................................... 226/76
See application file for complete search history.

(56) References Cited

U.S. PATENT DOCUMENTS

| | | | | |
|---|---|---|---|---|
| 6,082,603 A | * | 7/2000 | Takada | H05K 13/0215 |
| | | | | 226/76 |
| 6,202,913 B1 | * | 3/2001 | Takada | H05K 13/0417 |
| | | | | 156/934 |
| 6,260,260 B1 | * | 7/2001 | Suhara | H05K 13/0417 |
| | | | | 226/110 |

(Continued)

*Primary Examiner* — Leslie A Nicholson, III
(74) *Attorney, Agent, or Firm* — ScienBiziP, P.C.

(57) ABSTRACT

A deposit device is configured to temporarily store a carrier tape with through holes on the carrier tape platform. The carrier tape platform is used to pull the carrier tape to external equipment for processing. The deposit device includes a storage bin and a deposit assembly. The storage bin is configured to temporarily store the carrier tape and has an opening. The storage bin is configured to be mounted on the carrier tape platform to make the opening to correspond to the carrier tape. The deposit assembly includes a deposit driver and a deposit member. The deposit member with a plurality of teeth is located in the storage bin. The deposit driver is configured to drive the deposit member to rotate to cause one of the plurality of teeth to be located in one of the through holes, thereby driving the carrier tape to move into the storage bin.

10 Claims, 7 Drawing Sheets

(56) References Cited

U.S. PATENT DOCUMENTS

| | | | |
|---|---|---|---|
| 9,549,493 B2 * | 1/2017 | Youngquist | H05K 13/0409 |
| 9,820,420 B2 * | 11/2017 | Ohyama | H05K 13/0417 |
| 10,172,270 B2 * | 1/2019 | Youngquist | H05K 13/0419 |

* cited by examiner

DEPOSIT DEVICE

FIELD

The subject matter herein generally relates to a field of product processing, and in particular to a deposit device.

BACKGROUND

During the production process, it is necessary to connect the tail end of the carrier tape to the head end of the carrier tape of another reel. However, the current processing efficiency of the carrier tape is low.

Therefore, there is room for improvement within the art.

BRIEF DESCRIPTION OF THE DRAWINGS

Implementations of the present disclosure will now be described, by way of embodiments, with reference to the attached figures.

DETAILED DESCRIPTION

Figure 1:
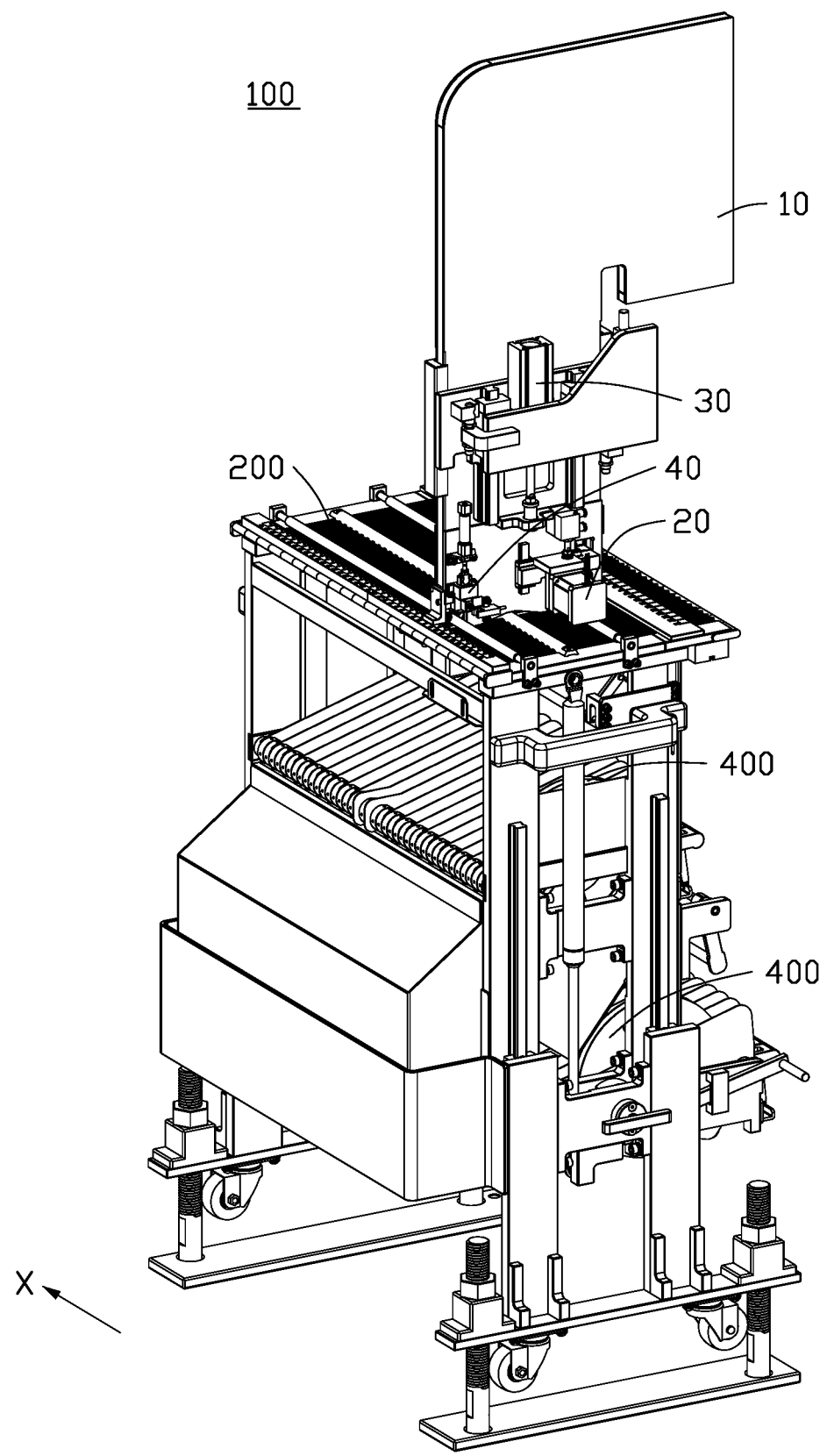
FIG. 1 is a schematic diagram of an embodiment of a deposit device and a carrier tape platform according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

An embodiment of a deposit device is provided. The deposit device is used for temporarily storing at least one carrier tape from a carrier tape platform. The carrier tape is provided with a plurality of through holes. The carrier tape platform is used for pulling the carrier tape to an external device for processing. The deposit device includes a storage bin and a deposit assembly. The storage bin is used for temporarily storing the carrier tape. The storage bin includes an opening. The storage bin is used for mounting on the carrier tape platform, so that the carrier tape is located in the opening. The deposit assembly includes a deposit driver and a deposit member connected to the deposit driver. The deposit member is located in the storage bin. A circumferential direction of the deposit member is provided with a plurality of teeth. The deposit driver is used to drive the deposit member to rotate, so that the plurality of teeth are arranged in the plurality of through holes, and the deposit member drives the carrier tape to move into the storage bin.

In the above deposit device, the deposit driver drives the deposit member to rotate, the teeth are arranged in the through holes, so that the carrier tape is driven to move into the storage bin. By temporarily storing the carrier tape in the buffer bin, the time for docking the carrier tape may be increased, so that an accuracy of docking may be improved, and there is no need for downtime. The production efficiency may be improved.

Referring to FIGS. 1, 2, 3, and 4, a deposit device 100 is used for temporarily storing at least one carrier tape 300 from the carrier tape platform 200. The carrier tape platform 200 cooperates with an external equipment to process the carrier tape 300. In at least one embodiment, the carrier tape 300 may be disposed on a material tray 400, and a head of the carrier tape 300 passes through the carrier tape platform 200 and is pulled to the external equipment for processing. In at least one embodiment, the carrier tape platform 200 may be provided with a plurality of grooves 201, and the carrier tape 300 is received in the plurality of grooves 201. In at least one embodiment, the carrier tape platform 200 may pull a plurality of carrier tapes 300 to the external equipment for processing. Each of the plurality of carrier tapes 300 includes a plurality of through holes 301, and the plurality of through holes 301 are evenly spaced along a length direction of the carrier tape 300.

The deposit device 100 includes a storage bin 10 and a deposit assembly 20. The storage bin 10 is used for temporarily storing the at least one carrier tape 300. The deposit assembly 20 is connected to the storage bin 10 and is used for driving at least one carrier tape 300 to be temporarily stored in the storage bin 10. In at least one embodiment, the storage bin 10 may have a first width, and each of the at least one carrier tape 300 may have a second width. In at least one embodiment, the first width may be equal to the second width. In at least one embodiment, the first width may be slightly greater than the second width, and a difference value between the first width and the second width is defined as d, wherein 1 mm≤d≤2 mm. In at least one embodiment, d may be 1 mm, 1.2 mm, 1.4 mm, 1.6 mm, 1.8 mm, or 2.0 mm. The at least one carrier tape 300 may be prevented from being rolled and folded in the storage bin 10 by controlling the width of the storage bin 10.

Figure 5:
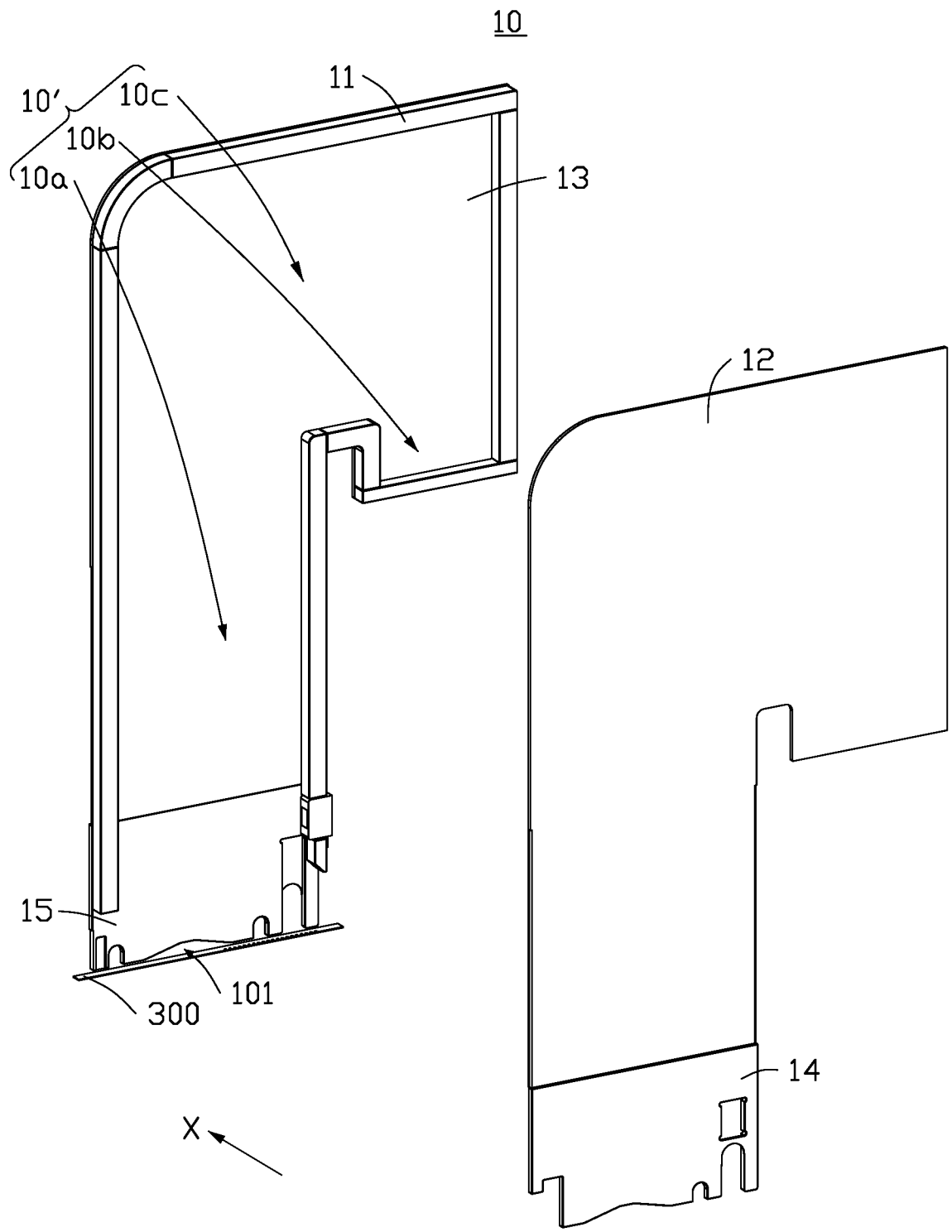
FIG. 5 is an exploded, diagrammatic view of an embodiment of a storage bin according to the present disclosure.

Referring to FIGS. 1 and 5, in at least one embodiment, the storage bin 10 may include a connecting frame 11, a first connecting plate 12, and a second connecting plate 13. The connecting frame 11 is sandwiched between the first connecting plate 12 and the second connecting plate 13, and a cavity 10' is surrounded by the connecting frame 11, the first connecting plate 12 and the second connecting plate 13. The at least one carrier tape 300 is located between the first connecting plate 12 and the second connecting plate 13. A shortest distance between the first connecting plate 12 and the second connecting plate 13 is the first width. In at least one embodiment, the storage bin 10 may further include a first fixing plate 14 and a second fixing plate 15. The connecting frame 11 is sandwiched between the first fixing plate 14 and the second fixing plate 15. The first fixing plate 14 is connected to the connecting frame 11 and abuts an end of the first connecting plate 12. The second fixing plate 15 is connected to the connecting frame 11 and abuts an end of the second connecting plate 13. The deposit assembly 20 connects the first fixing plate 14 and the second fixing plate 15. A shortest distance between the first fixing plate 14 and the second fixing plate 15 is the first width. The first fixing plate 14 and the second fixing plate 15 are arranged to install the deposit assembly 20.

The storage bin 10 includes an opening 101, the at least one carrier tape 300 enters the storage bin 10 through the opening 101. The opening 101 is adjacent to the deposit assembly 20. When temporarily storing the at least one carrier tape 300, the at least one carrier tape 300 is positioned at the opening 101, and then the deposit assembly 20 drives the at least one carrier tape 300 to move so that the at least one carrier tape 300 enters the storage bin 10 from the opening 101.

In at least one embodiment, the cavity 10' includes a first portion 10a and a second portion 10b. The first portion 10a communicates with the second portion 10b. The opening 101 is disposed corresponding to the first portion 10a. When temporarily storing the at least one carrier tape 300, the at least one carrier tape 300 is positioned at the opening 101, and then the deposit assembly 20 drives the at least one carrier tape 300 to move so that the at least one carrier tape 300 enters the first portion 10a from the opening 101 and then goes to the second portion 10b from the first portion 10a. The at least one carrier tape 300 is finally temporarily stored in the second portion 10b.

In at least one embodiment, the first portion 10a and the second portion 10b may extend in the vertical direction, respectively. The first portion 10a and the second portion 10b may be arranged side by side in the horizontal direction, and a third portion 10c extending in the horizontal direction communicates with the ends of the first portion 10a and the second portion 10b on the same side, so that the cavity 10' is a bent space and the at least one carrier tape 300 may not be easy to fall from the first portion 10a after the at least one carrier tape 300 enters the second portion 10b.

In at least one embodiment, the storage bin 10 may be roughly L-shaped.

Figure 2:
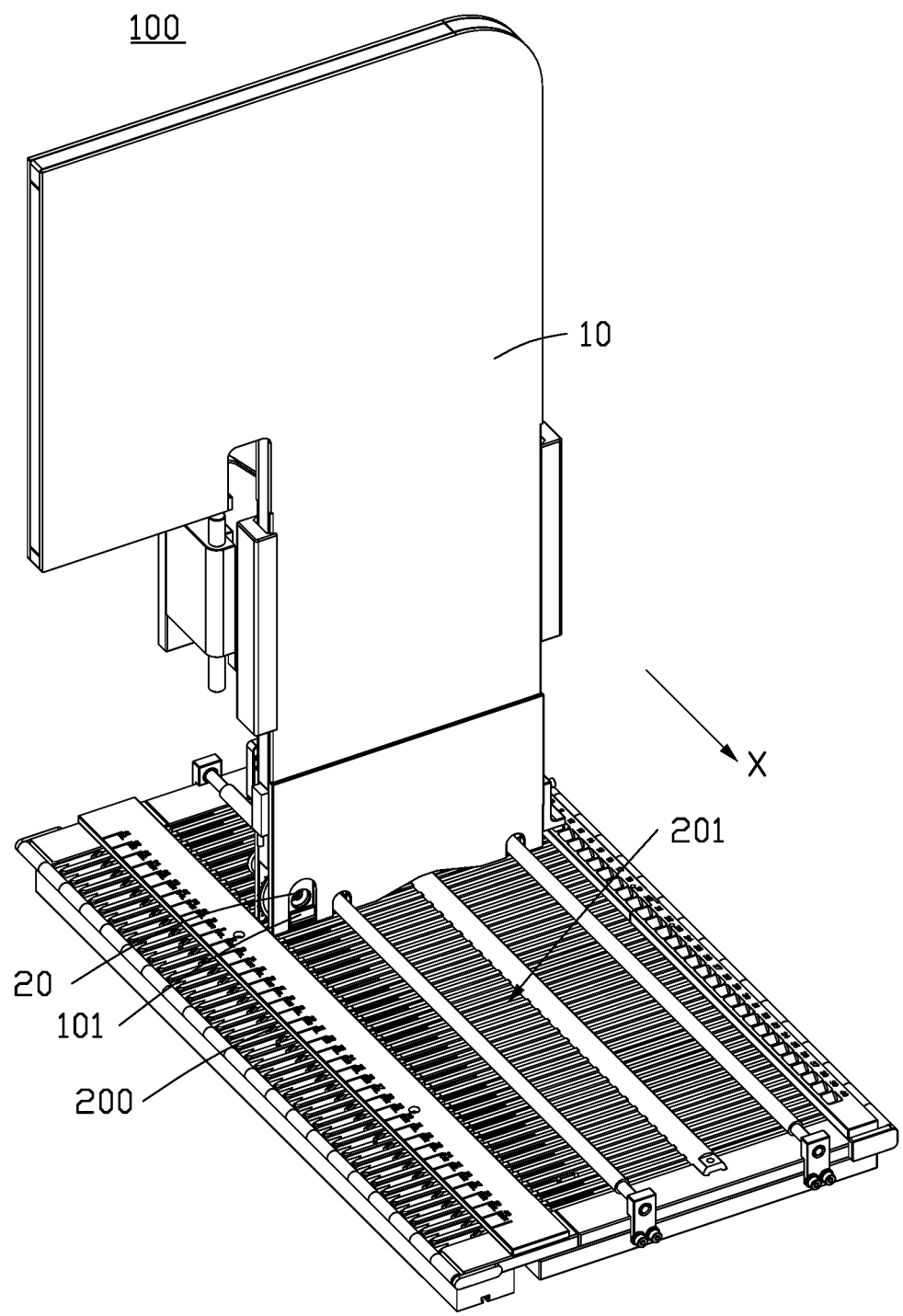
FIG. 2 is a schematic diagram of an embodiment of a deposit device and a carrier tape platform from another angle according to the present disclosure.
Figure 6:
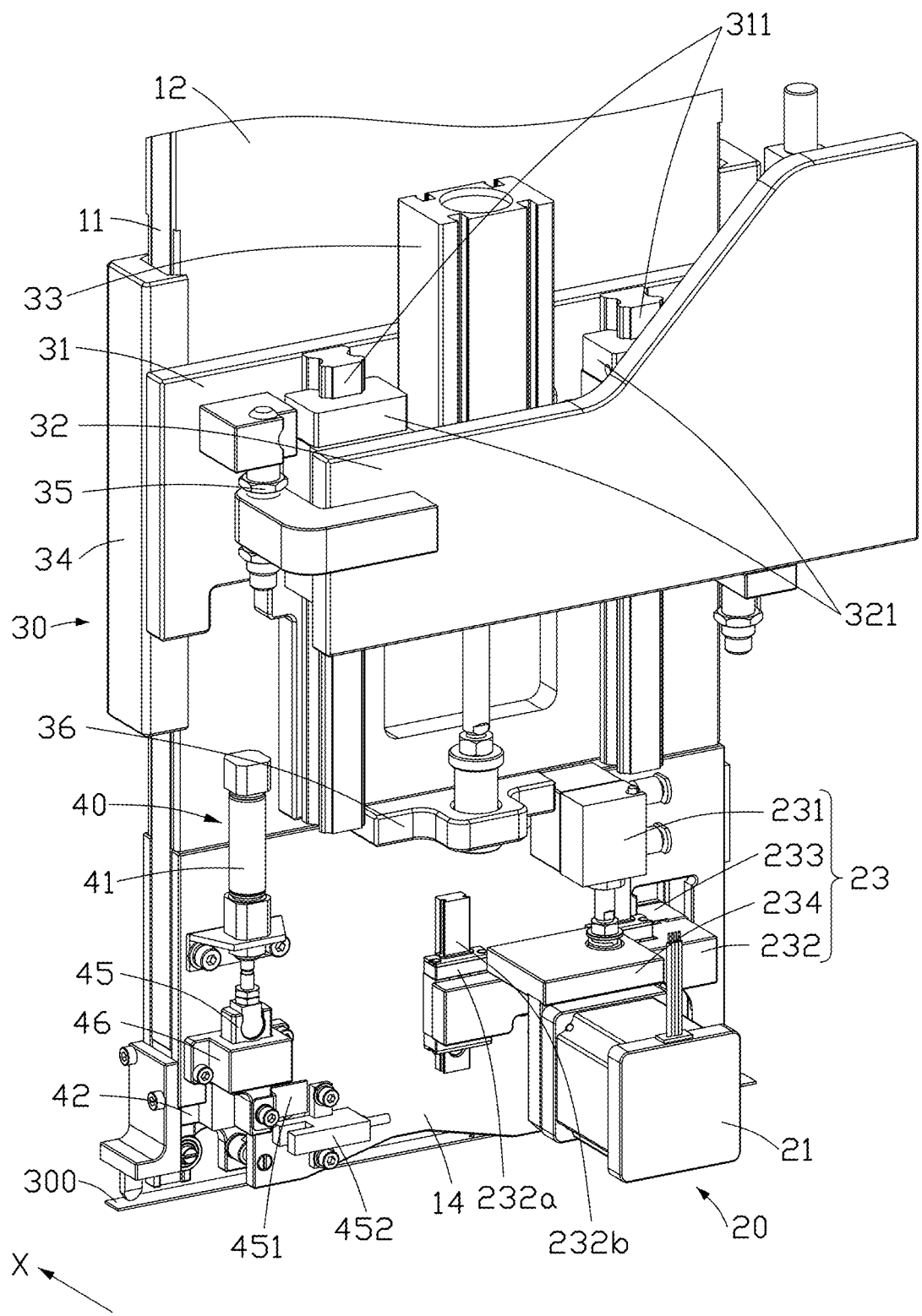
FIG. 6 is a schematic diagram of an embodiment of a storage bin, a moving assembly, a deposit assembly, and a belt pressing assembly according to the present disclosure.

Referring to FIGS. 1, 2, and 6, in at least one embodiment, the deposit device 100 may further include a moving assembly 30. The moving assembly 30 is connected to the storage bin 10 for driving the storage bin 10 close to or away from the at least one carrier tape 300. The moving assembly 30 includes a first mounting plate 31, a second mounting plate 32 and a moving driver 33. The first mounting plate 31 is connected to opposite sides of the connecting frame 11. In at least one embodiment, the first mounting plate 31 may be connected to each of the opposite sides of the connecting frame 11 through a fixing block 34. The fixing block 34 is mounted on one of the opposite sides of the connecting frame 11 and contacts the first connecting plate 12 and the second connecting plate 13. The second mounting plate 32 is elastically connected to the first mounting plate 31, and there is a moving virtual position between the second mounting plate 32 and the first mounting plate 31. In at least one embodiment, the second mounting plate 32 is connected to the first mounting plate 31 through a buffer member 35.

In at least one embodiment, the first mounting plate 31 may be provided with a first sliding rail 311, and the second mounting plate 32 may be provided with a first sliding block 321, the first sliding block 321 is slidably connected to the first sliding rail 311.

A main body of the moving driver 33 is connected to the second mounting plate 32, a driving shaft of the moving driver 33 is connected to the first mounting plate 31 through a third mounting plate 36. The moving driver 33 drives the first mounting plate 31 to move relative to the second mounting plate 32 and drives the storage bin 10 to move, so that the at least one carrier tape 300 approaches the opening 101 or moves away from the opening 101. It can be understood that a moving distance of the first mounting plate 31 relative to the second mounting plate 32 is a buffer distance of the buffer member 35

In at least one embodiment, the deposit device 100 may further include a transfer assembly (not shown). When one of the at least one carrier tape 300 on the carrier tape platform 200 needs to be temporarily stored, the transfer assembly is used to drive the storage bin 10 and the deposit assembly 20 connected to the storage bin 10 and other components to move above the carrier tape 300, and then the moving driver 33 drives the first mounting plate 31 to move relative to the second mounting plate 32, and drives the storage bin 10 close to the carrier tape 300 so that the carrier tape 300 is close to the opening 101, and then the deposit assembly 20 temporarily stores the carrier tape 300 into the storage bin 10. It can be understood that the deposit assembly 20 temporarily stores the remaining part of the at least one carrier tape 300 on the material tray 400 to the storage bin 10 in advance, so as to find the tail end of the carrier tape 300 in advance. When the tail end of the carrier tape 300 on one material tray 400 is docked with the head end of another carrier tape 300 on another material tray 400, the carrier tape 300 temporarily stored in the storage bin 10 can be drawn to the external equipment for processing. By temporarily storing the carrier tape 300 in the storage bin 10, the time for docking the carrier tapes 300 can be increased, the accuracy of the docking can be improved, and the production efficiency can be improved without shutting down.

Figure 3:
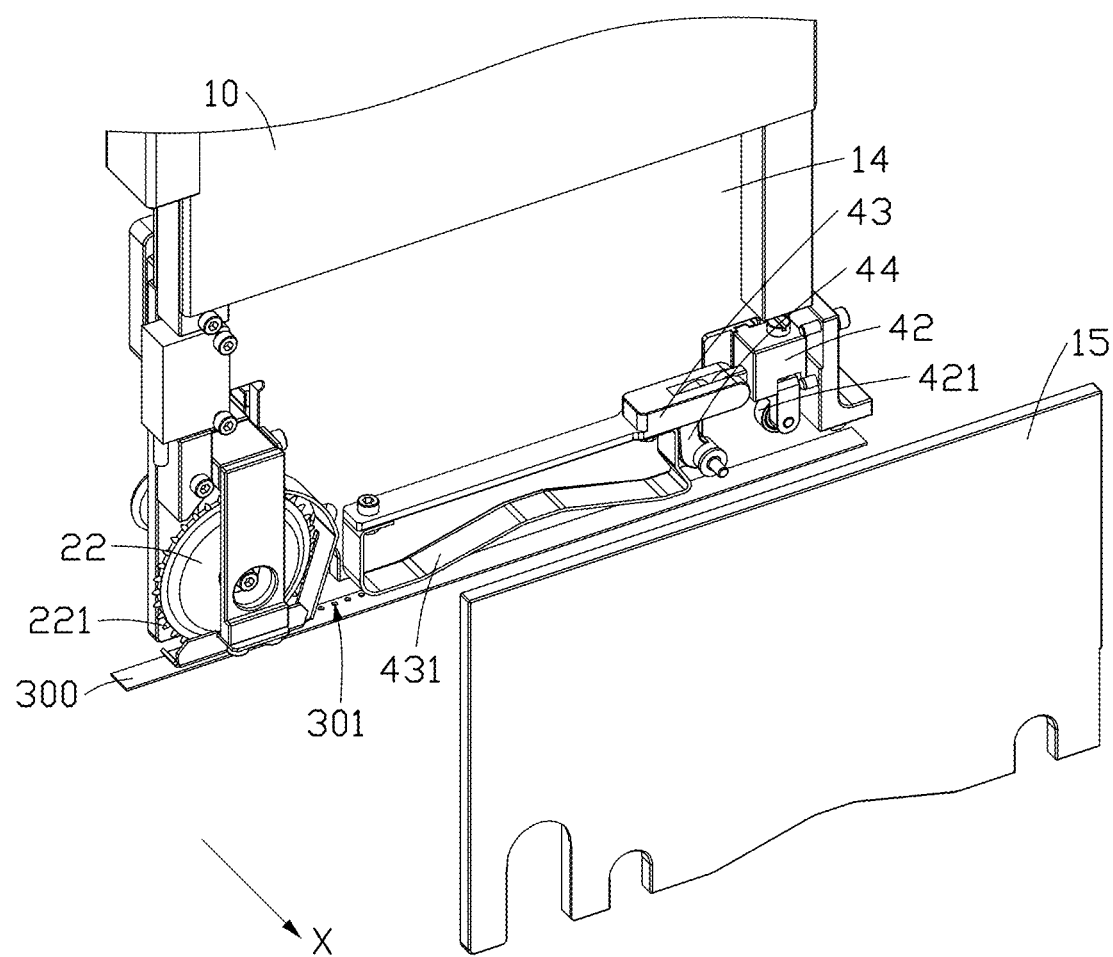
FIG. 3 is a partially exploded, diagrammatic view of an embodiment of a deposit device according to the present disclosure.
Figure 4:
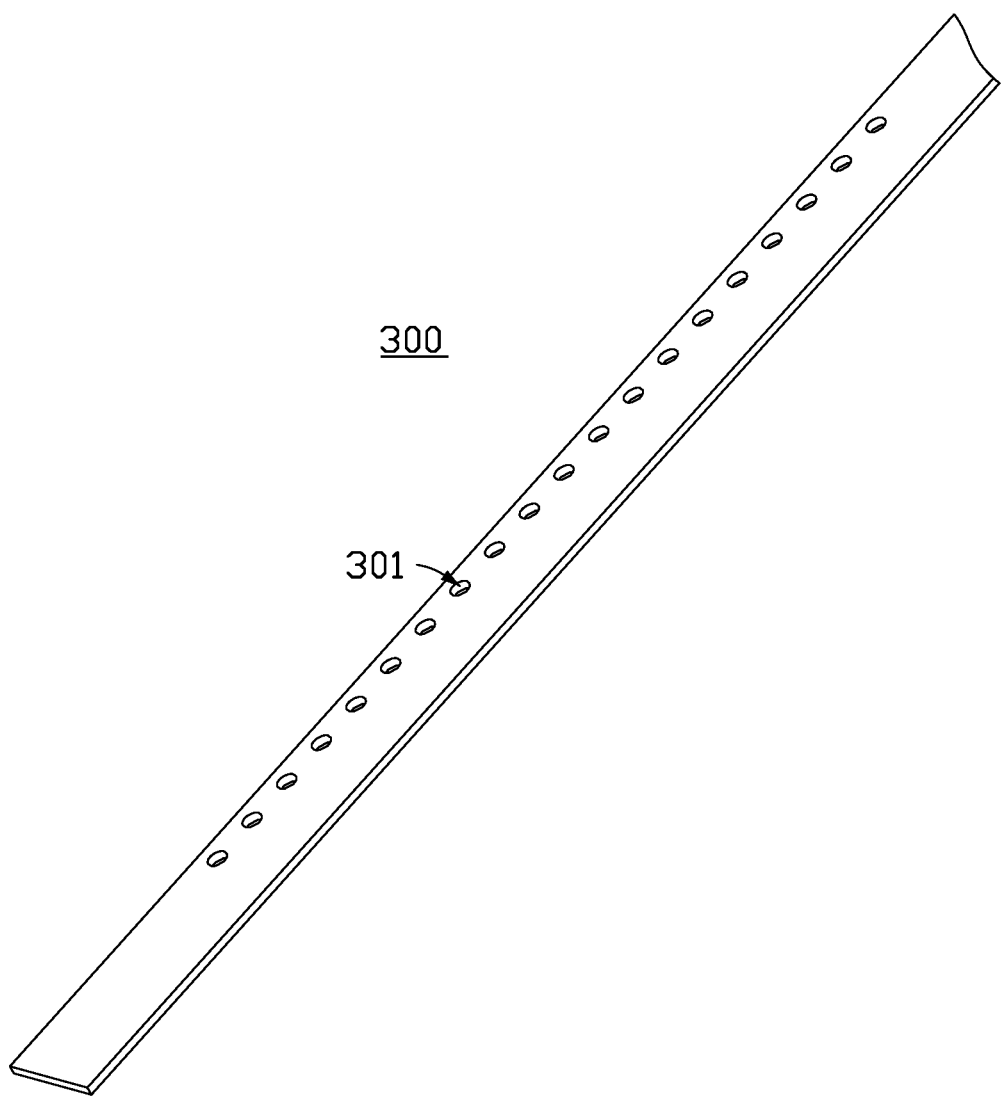
FIG. 4 is a schematic diagram of an embodiment of a carrier tape according to the present disclosure.
Figure 7:
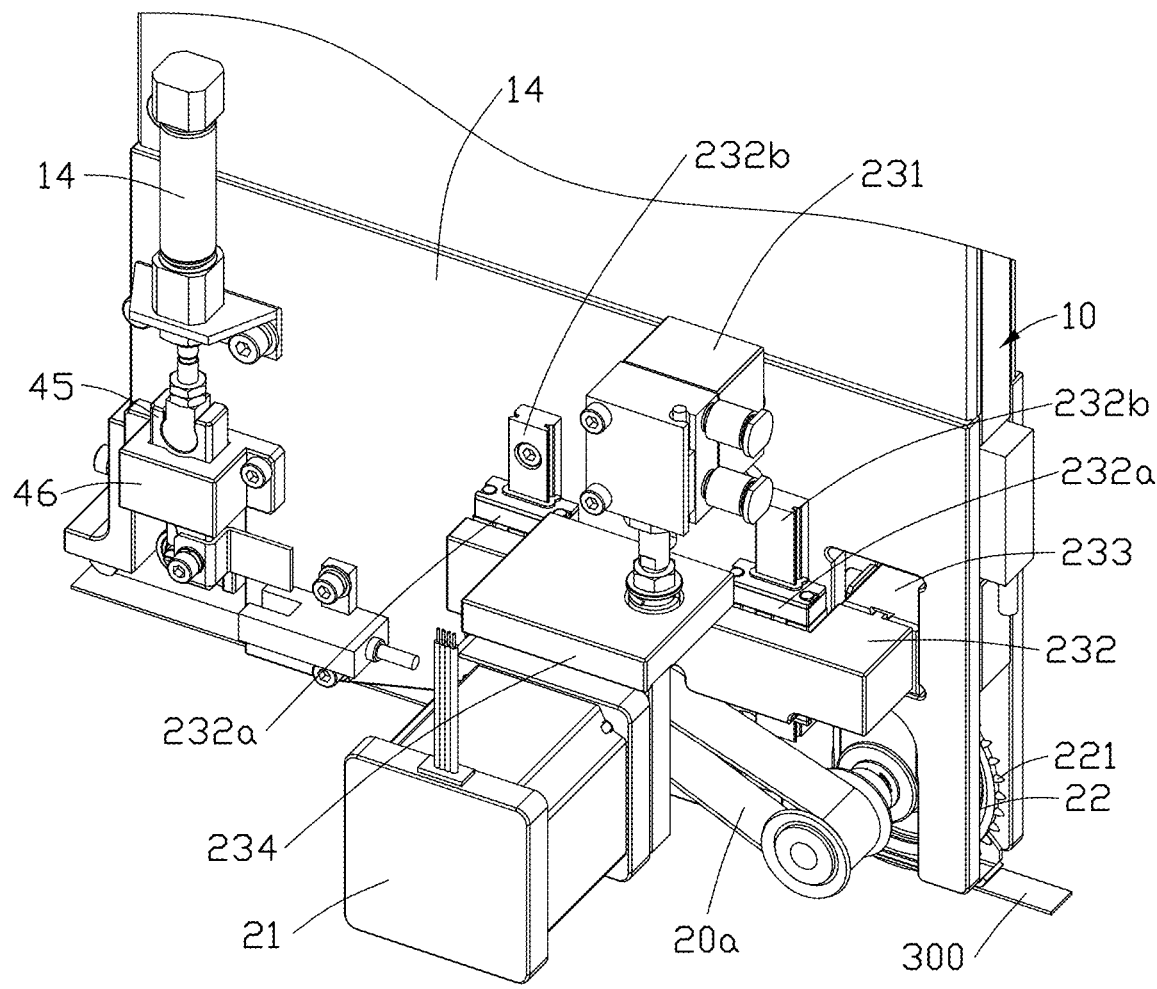
FIG. 7 is a schematic diagram of an embodiment of a storage bin, a deposit assembly, and a belt pressing assembly from anther angle according to the present disclosure.

Referring to FIGS. 3, 6, and 7, the deposit assembly 20 includes a deposit driver 21 and a deposit member 22. The deposit driver 21 is fixed on the first fixing plate 14 and the deposit driver 21 is connected to the deposit member 22. The deposit driver 21 is used to drive the deposit member 22 to rotate. In at least one embodiment, the deposit driver 21 may include a motor, and the deposit driver 21 and the deposit member 22 may be connected through a synchronous belt 20a.

The deposit member 22 is located in the storage bin 10 and the deposit member 22 is used to contact the at least one carrier tape 300. In at least one embodiment, the deposit member 22 may be located between the first fixing plate 14 and the second fixing plate 15. A plurality of teeth 221 are arranged along a periphery of the deposit member 22 for cooperating with the plurality of through holes 301. There is a second distance between any two adjacent teeth 221, and there is a first distance between any two adjacent through holes 301. The second distance is equal to the first distance. When the deposit driver 21 drives the deposit member 22 to rotate, one of the plurality of teeth 221 is located in one of the plurality of through holes 301. The deposit member 22 rotates and drives the at least one carrier tape 300 to move into the storage bin 10. In at least one embodiment, the deposit member 22 may include a toothed disc.

In a least one embodiment, the deposit assembly 20 may further include a deposit moving mechanism 23 for driving the deposit driver 21 and the deposit member 22 to approach or move away from the at least one carrier tape 300. The deposit moving mechanism 23 includes a deposit moving driver 231, a mounting block 232, and a rotational frame 233. The deposit moving driver 231 is mounted on a side of the first fixing plate 14 facing away from the second fixing plate 15, a driving end of the deposit moving driver 231 is connected to the deposit driver 21 and the mounting block 232. In at least one embodiment, a fourth mounting plate 234 may be arranged on the driving end of the deposit moving driver 231, the fourth mounting plate 234 connects the deposit driver 21 and the mounting block 232. The mounting block 232 is slidably connected to the first fixing plate 14. In at least one embodiment, the mounting block 232 may include a second sliding block 232a and a second sliding rail 232b. The second sliding rail 232b is mounted on a side of the first fixing plate 14 facing away from the second fixing plate 15, and the second sliding block 232a is slidably installed on the second sliding rail 232b. The rotational frame 233 is connected to the mounting block 232, the deposit member 22 is rotatably connected to the rotational frame 233. The second sliding block 232a is driven to slide on the second sliding rail 232b by the deposit moving driver 231, thereby driving the deposit driver 21, the deposit member 22, and the rotational frame 233 by the second sliding block 232a to move together, so that the deposit member 22 is close to or far away from the at least one carrier tape 300. When the at least one carrier tape 300 needs to be temporarily stored, the deposit member 22 is close to the at least one carrier tape 300 and one of the plurality of teeth 221 is located in one of the plurality of through holes 301. When the temporarily storing is finished, the deposit member 22 is far away from the at least one carrier tape 300 and the plurality of teeth 221 are separated from the plurality of through holes 301.

Referring to FIGS. 3, 6, and 7, in at least one embodiment, the deposit device 100 may further include a belt pressing assembly 40. The at least one carrier tape 300 moves from one end of the carrier tape platform 200 where the deposit member 22 is located to another end of the carrier tape platform 200 where the belt pressing assembly 40 is located, and the at least one carrier tape 300 extends from the carrier tape platform 200 to external equipment. In at least one embodiment, the first fixing plate 14 and the second fixing plate 15 are arranged along a first direction X, and viewed along the first direction X, a rotating direction of the deposit member 22 is the same as a moving direction of the at least one carrier tape 300. Viewed along the first direction X, when the at least one carrier tape 300 moves from the end of the carrier tape platform 200 where the deposit member 22 is located to the end of the carrier tape platform 200 where the belt pressing assembly 40 is located, the deposit member 22 rotates clockwise.

In at least one embodiment, the belt pressing assembly 40 may include a belt pressing driver 41, a mounting block 42, a first connecting rod 43, and a second connecting rod 44. The mounting block 42, the first connecting rod 43, and the second connecting rod 44 are located in the storage bin 10. In at least one embodiment, the mounting block 42, the first connecting rod 43, and the second connecting rod 44 may be located between the first fixing plate 14 and the second fixing plate 15. The belt pressing driver 41 is installed on the first fixing plate 14, and the mounting block 42 is connected to the belt pressing driver 41. The first connecting rod 43 is rotatably connected to the mounting block 42, and the second connecting rod 44 is rotatably connected to the first fixing plate 14 and the first connecting rod 43. The belt pressing driver 41 drives the mounting block 42 to move to drive the first connecting rod 43 to rotate relative to the mounting block 42 and the second connecting rod 44, so that the first connecting rod 43 approaches or moves away from the at least one carrier tape 300. In at least one embodiment, a stopper 431 is installed on the first connecting rod 43 and is located between the first connecting rod 43 and the at least one carrier tape 300. A gap is formed between the stopper 431 and the at least one carrier tape 300, so as to prevent the stopper 431 from pressing the at least one carrier tape 300 and restricting the at least one carrier tape 300. The at least one carrier tape 300 cam be limited to move in the plurality of grooves 201 by the stopper 431.

In at least one embodiment, a pressing wheel 421 is mounted on the mounting block 42. When the belt pressing driver 41 drives the mounting block 42 to move toward the at least one carrier tape 300, the first connecting rod 43 is driven to rotate away from the at least one carrier tape 300, and the pressing wheel 421 is driven to contact the at least one carrier tape 300, so that the at least one carrier tape 300 is moved to the external equipment when it is located in the plurality of grooves 201, so as to avoid the position deviation of the at least one carrier tape 300 and affect processing of the external equipment.

When the moving driver 33 drives the first mounting plate 31 to move relative to the second mounting plate 32, and drives the storage bin 10 to approach the at least one carrier tape 300 to make the at least one carrier tape 300 to be located in the opening 101. At this time, the at least one carrier tape 300 has not yet been temporarily stored, the stopper 431 is arranged above the at least one carrier tape 300 to assist in limiting the position of the at least one carrier tape 300. When the at least one carrier tape 300 needs to be temporarily stored, the belt pressing driver 41 drives the mounting block 42 to move downward, and the mounting block 42 drives the first connecting rod 43 to rotate away from the at least one carrier tape 300, so that the stopper 431 is away from the at least one carrier tape 300 and the pressing wheel 421 is driven to contact the at least one carrier tape 300. Then the deposit assembly 20 starts to temporarily store the at least one carrier tape 300.

In at least one embodiment, the belt pressing assembly 40 may further include a connecting block 45 and a guiding block 46. The guiding block 46 is arranged on the first fixing plate 14. The connecting block 45 is connected to the belt pressing driver 41 and the mounting block 42, and the connecting block 45 passes through the guiding block 46. The belt pressing driver 41 can drive the connecting block 45 to slide in the guiding block 46, and the connecting block 45 can drive the mounting block 42 to move.

In at least one embodiment, a stopping piece 451 is arranged on the connecting block 45, a stopping member 452 is arranged on the first fixing plate 14. The belt pressing driver 41 can drive the connecting block 45 to move, so that the stopping piece 451 moves into the stopping member 452 to limit the movement of the connecting block 45, and so as to limit a rotation range of the first connecting rod 43 and prevent the first connecting rod 43 from colliding with an inner wall of the storage bin 10.

When the deposit device 100 is in use, firstly, the storage bin 10, the deposit assembly 20, the moving assembly 30, and the belt pressing assembly 40 are moved to the position of the at least one carrier tape 300 which needs to be temporarily stored. The moving driver 33 drives the first mounting plate 31 to move relative to the second mounting plate 32 and drives the storage bin 10 to move, so that the at least one carrier tape 300 is located in the opening 101. At this time, the stopper 431 is located above the at least one carrier tape 300, which assists in limiting the moving position of the at least one carrier tape 300. When the at least one carrier tape 300 needs to be temporarily stored, the belt pressing driver 41 drives the mounting block 42 to move downward, and the mounting block 42 drives the first connecting rod 43 to rotate away from the at least one carrier tape 300, so that the stopper 431 is away from the at least one carrier tape 300 and the pressing wheel 421 is driven to contact the at least one carrier tape 300. Then the second sliding block 232a is driven to slide on the second sliding rail 232b by the deposit moving driver 231, thereby driving the deposit driver 21, the deposit member 22, and the rotational frame 233 by the second sliding block 232a to move together, so that the deposit member 22 is close to the at least one carrier tape 300. When the deposit driver 21 drives the deposit member 22 to rotate, one of the plurality of teeth 221 is located in one of the plurality of through holes 301, which drives the at least one carrier tape 300 to enter the first portion 10a and drives the at least one carrier tape 300 to enter the second portion 10b from the first portion 10a. The at least one carrier tape 300 is finally temporarily stored in the second portion 10b. After storing is completed, the deposit assembly 20, the moving assembly 30, and the belt pressing assembly 40 are reset. When the external equipment processes that at least one carrier tape 300 in the storage bin 10, and the time spent in processing the at least one carrier tape 300 in the storage bin 10 can be used to connect the tail end of the at least one carrier tape 300 to the head end of the at least one carrier tape 300 of another material tray 400.

In the above deposit device 100, the deposit driver 21 drives the deposit member 22 to rotate, one of the plurality of teeth 221 of the deposit member 22 is located in one of the plurality of through holes 301, which drives the at least one carrier tape 300 to enter the storage bin 10 to be temporarily stored in the storage bin 10. The above deposit device 100 can increase the time for docking the carrier tape 300, improve the accuracy of docking, and improve production efficiency without shutting down.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A deposit device for temporarily storing at least one carrier tape with through holes from a carrier tape platform for pulling the at least one carrier tape to external equipment for processing, comprising:
   a storage bin configured to temporarily store the at least one carrier tape and be mounted on the carrier tape platform, an opening arranged on the storage bin, the at least one carrier tape is located in the opening when the storage bin is mounted on the carrier tape platform; and
   a deposit assembly comprising a deposit driver and a deposit member connected to the deposit driver, wherein the deposit member is located in the storage bin, a circumferential direction of the deposit member is provided with a plurality of teeth, the deposit driver is configured to drive the deposit member to rotate to cause one of the plurality of teeth to be located in one of the through holes, thereby driving the at least one carrier tape to move into the storage bin.

2. The deposit device of claim 1, wherein the storage bin comprises a first portion and a second portion, the opening is disposed corresponding to the first portion, the first portion and the second portion are arranged side by side in the horizontal direction, the deposit member is configured to drive the at least one carrier tape to pass through the first portion and be temporarily stored in the second portion.

3. The deposit device of claim 1, wherein the deposit device further comprises a moving assembly, the moving assembly comprises a first mounting plate, a second mounting plate, and a moving driver, the first mounting plate is connected to an outer surface of the storage bin and the first mounting plate is elastically connected to the second mounting plate, the moving driver is connected to the first mounting plate and the second mounting plate, the moving driver is configured to drive the first mounting plate to move relative to the second mounting plate and drive the storage bin to move.

4. The deposit device of claim 1, wherein the deposit assembly further comprises a deposit moving mechanism, the deposit moving mechanism comprises a deposit moving driver, a mounting block, and a rotational frame, the deposit moving driver is arranged on an outer surface of the storage bin, the deposit moving driver is connected to the mounting block and the deposit driver, the mounting block is connected to the rotational frame, the deposit member is rotatably connected to the rotational frame, the deposit moving driver is configured to drive the mounting block and the rotational frame to move and drive the deposit member to be close to or far away from the at least one carrier tape.

5. The deposit device of claim 1, wherein the deposit device further comprises a belt pressing assembly, the belt pressing assembly comprises a belt pressing driver, a mounting block, a first connecting rod, and a second connecting rod, the belt pressing driver is arranged on an outer surface of the storage bin, the belt pressing driver is connected to the mounting block, the mounting block is rotatably connected to the first connecting rod, the second connecting rod is rotatably connected to the first connecting rod and the storage bin, a stopper is installed on the first connecting rod and is configured to limit a position of the at least one carrier tape, the belt pressing driver is configured to drive the mounting block to move and the mounting block is configured to drive the first connecting rod to rotate, thereby driving the stopper to be close to or far away from the at least one carrier tape.

6. The deposit device of claim 5, wherein a pressing wheel is mounted on the mounting block, the belt pressing driver is also configured to drive the pressing wheel to press the at least one carrier tape.

7. The deposit device of claim 5, wherein the belt pressing assembly further comprises a connecting block and a guiding block, the guiding block is arranged on the outer surface of the storage bin, the connecting block passes through the guiding block, and the connecting block is connected to the belt pressing driver and the mounting block.

8. The deposit device of claim 7, wherein a stopping piece is arranged on the connecting block, a stopping member is arranged on the outer surface of the storage bin, the belt pressing driver is configured to drive the connecting block to move to drive the stopping piece to move to the stopping member, thereby limiting a moving distance of the connecting block and limiting a rotation range of the first connecting rod.

9. The deposit device of claim 1, wherein the storage bin has a first width, each of the at least one carrier tape has a second width, and the first width is greater than or equal to the second width.

10. The deposit device of claim 1, wherein a distance between any two adjacent through holes is defined as a first distance, a distance between any two adjacent teeth is defined as a second distance, the first distance is equal to the second distance.

* * * * *